United States Patent
Lee et al.

(10) Patent No.: US 9,653,212 B2
(45) Date of Patent: May 16, 2017

(54) MULTILAYER CERAMIC CAPACITOR AND BOARD FOR MOUNTING THEREOF

(71) Applicant: SAMSUNG ELECTRO-MECHANICS CO., LTD., Suwon-Si, Gyeonggi-Do (KR)

(72) Inventors: Kyo Kwang Lee, Suwon-Si (KR); Jin Kim, Suwon-Si (KR); Young Ghyu Ahn, Suwon-Si (KR); Byoung Hwa Lee, Suwon-Si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/458,006

(22) Filed: Aug. 12, 2014

(65) Prior Publication Data

US 2015/0047890 A1   Feb. 19, 2015

(30) Foreign Application Priority Data

Aug. 13, 2013   (KR) .................. 10-2013-0095952
Jul. 10, 2014   (KR) .................. 10-2014-0087022

(51) Int. Cl.
*H01G 4/12* (2006.01)
*H05K 1/18* (2006.01)
*H01G 4/30* (2006.01)
*H01G 4/012* (2006.01)
*H01G 4/232* (2006.01)

(52) U.S. Cl.
CPC ............ *H01G 4/30* (2013.01); *H01G 4/012* (2013.01); *H01G 4/232* (2013.01); *H05K 1/181* (2013.01); *H05K 2201/10015* (2013.01)

(58) Field of Classification Search
CPC ........... H05K 1/181; H01G 4/12; H01G 4/306
See application file for complete search history.

(56) References Cited

U.S. PATENT DOCUMENTS

| | | |
|---|---|---|
| 6,950,300 B2 | 9/2005 | Sutardja |
| 2008/0186652 A1 | 8/2008 | Lee et al. |
| 2009/0073634 A1 | 3/2009 | Lee et al. |
| 2009/0086403 A1 | 4/2009 | Lee et al. |
| 2010/0149769 A1 | 6/2010 | Lee et al. |
| 2010/0254070 A1 | 10/2010 | Lee et al. |

(Continued)

FOREIGN PATENT DOCUMENTS

| | | |
|---|---|---|
| JP | 60-048230 U | 4/1985 |
| JP | 2008-193055 A | 8/2008 |

(Continued)

OTHER PUBLICATIONS

Notice of Office Action issued in Japanese Patent Application No. 2014-164134, mailed on Nov. 17, 2015; with English translation.

(Continued)

*Primary Examiner* — Jeremy C Norris
(74) *Attorney, Agent, or Firm* — McDermott Will & Emery LLP

(57) ABSTRACT

A multilayer ceramic capacitor may include three external electrodes disposed on a mounting surface of a ceramic body so as to be spaced apart from each other. When a height of at least one portion of the external electrode formed on one side surface of the ceramic body in a width direction is defined as d, and a thickness of the ceramic body is defined as T, a ratio of d/T satisfies $0.10 \leq d/T$.

7 Claims, 12 Drawing Sheets

(56) References Cited

U.S. PATENT DOCUMENTS

2013/0056252 A1    3/2013  Fujii et al.
2013/0063864 A1    3/2013  Xiao

FOREIGN PATENT DOCUMENTS

| JP | 2009-021512 A | 1/2009 |
|----|---------------|--------|
| JP | 2009-065198 A | 3/2009 |
| JP | 2009-088516 A | 4/2009 |
| JP | 2011-097091 A | 5/2011 |
| JP | 2013-065820 A | 4/2013 |
| KR | 10-2008-0073193 A | 8/2008 |
| KR | 10-2010-0068056 A | 6/2010 |
| KR | 10-2012-0042812 A | 5/2012 |

OTHER PUBLICATIONS

Notice of Office Action issued Dec. 28, 2015, in Korean Patent Application No. 10-2014-0087022; English Translation provided.
Pretrial Reexamination Report dated Sep. 5, 2016 issued in Japanese Patent Application No. 2014-164134 (with English translation).
U.S. Office Action dated Oct. 5, 2016 issued in U.S. Appl. No. 14/807,679.

MULTILAYER CERAMIC CAPACITOR AND BOARD FOR MOUNTING THEREOF

CROSS-REFERENCE TO RELATED APPLICATION

This application claims the benefit of Korean Patent Application No. 10-2013-0095952 filed on Aug. 13, 2013 and Korean Patent Application No. 10-2014-0087022 filed on Jul. 10, 2014, with the Korean Intellectual Property Office, the disclosure of which is incorporated herein by reference.

BACKGROUND

The present disclosure relates to a multilayer ceramic capacitor and a board for mounting thereof.

As electronic components using a ceramic material, there are capacitors, inductors, piezoelectric elements, varistors, thermistors, and the like.

Among these ceramic electronic components, a multilayer ceramic capacitor (MLCC) has advantages such as a small size, high capacitance, and easiness of mounting and has been usefully used as a decoupling capacitor disposed in a high frequency circuit such as a power supply circuit of a large scale integration circuit (LSI), or the like.

In this case, stability of the power supply circuit depends on equivalent serial inductance (ESL) of the multilayer ceramic capacitor. Particularly, stability of the power supply circuit is high at relatively low ESL.

Therefore, in order to stabilize the power supply circuit, the multilayer ceramic capacitor should have lower ESL, and as an electronic device has been used at a high frequency and high current, the demand for low ESL has further increased.

In addition, the multilayer ceramic capacitor is used as an electromagnetic interference (EMI) filter in addition to the use thereof as the decoupling capacitor. In this case, in order to improve high frequency noise removal and attenuation characteristics, ESL is required to be lower.

Some of three-terminal type capacitors having a structure in which internal electrodes are vertically disposed on a board mounting surface and dielectric layers formed using a ceramic material and internal electrodes formed using a metal are alternately stacked in order to decrease ESL have been disclosed.

However, in the case of the three-terminal type multilayer ceramic capacitor, adhesion strength between a ground terminal formed in a central portion of the ceramic body and the ceramic body is relatively low, such that reliability of a product may be deteriorated.

Meanwhile, since the dielectric layers of the multilayer ceramic capacitor have piezoelectricity and electrostriction, when a direct current (DC) voltage or an alternating current (AC) voltage is applied to the multilayer ceramic capacitor, a piezoelectric phenomenon may occur between internal electrodes, causing the occurrence of vibrations.

This vibration is transferred to a board on which the multilayer ceramic capacitor is mounted through an external electrode of the multilayer ceramic capacitor, such that the entirety of a board acts as a sound reflective surface to generate a vibration sound, noise.

Such a vibration sound may have a frequency corresponding to an audio frequency in a region of 20 to 20,000 Hz giving an unpleasant feeling to listeners, and is known as acoustic noise.

SUMMARY

Some embodiments in the present disclosure may provide a multilayer ceramic capacitor capable of decreasing equivalent serial inductance (ESL) of the multilayer ceramic capacitor, improving adhesion strength of an external electrode, and decreasing acoustic noise at the time of mounting the multilayer ceramic capacitor on a board, and a board for mounting thereof.

According to some embodiments in the present disclosure, a multilayer ceramic capacitor may include three external electrodes disposed so as to be spaced apart from each other on a mounting surface of a ceramic body, wherein when a height of at least one portion of the external electrode formed on one side surface of the ceramic body in a width direction is defined as d, and a thickness of the ceramic body is defined as T, a ratio of d/T satisfies $0.10 \leq d/f < 0.50$.

According to some embodiments in the present disclosure, a multilayer ceramic capacitor may include: a ceramic body including a plurality of dielectric layers and a plurality of first and second internal electrodes; first and second external electrodes disposed on a mounting surface of the ceramic body so as to be spaced apart from each other in a length direction of the ceramic body, and connected to the plurality of first internal electrodes; and a third external electrode disposed between the first and second external electrodes, and connected to the plurality of second internal electrodes, wherein at least one portion of the first to third external electrode extended on both side surface of the ceramic body in the width direction and when a height of at least one portion thereof formed on one side surface of the ceramic body in the width direction is defined as d, and a thickness of the ceramic body is defined as T, a ratio of d/T satisfies $0.10 \leq d/T$.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
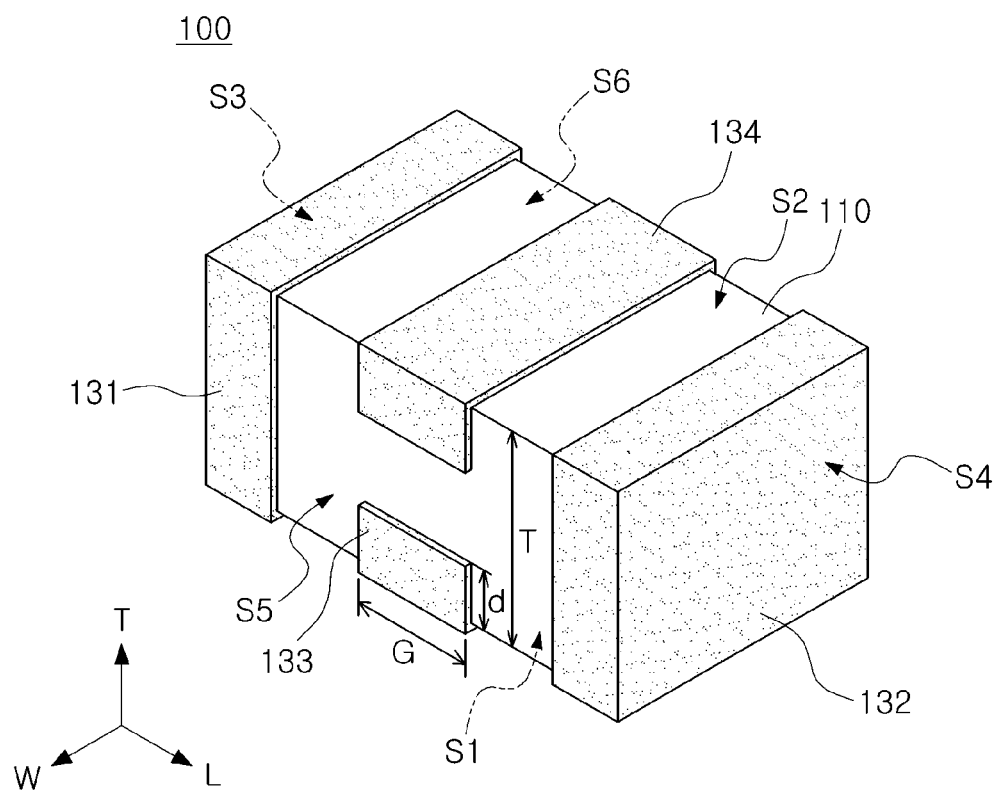
FIG. 1 is a perspective view schematically illustrating a multilayer ceramic capacitor according to an exemplary embodiment in the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Multilayer Ceramic Capacitor

Figure 2:
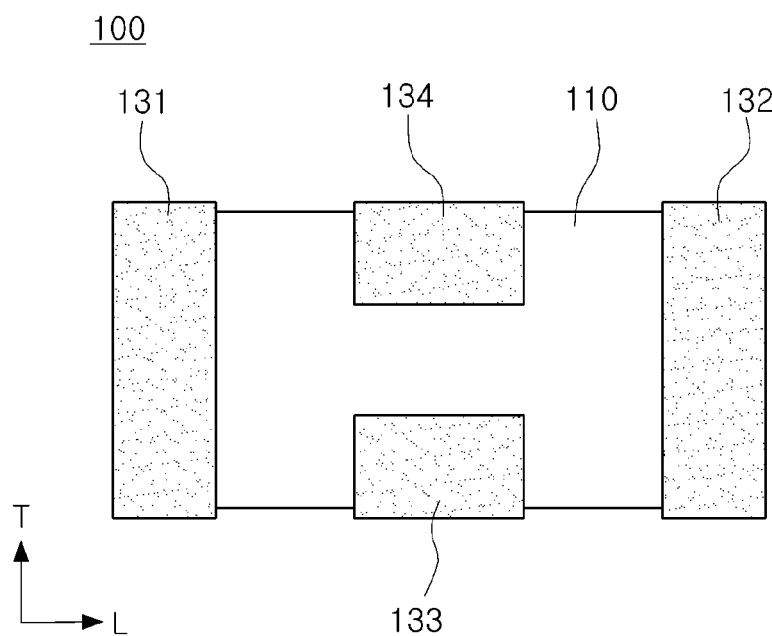
FIG. 2 is a side view of FIG. 1.
Figure 3:
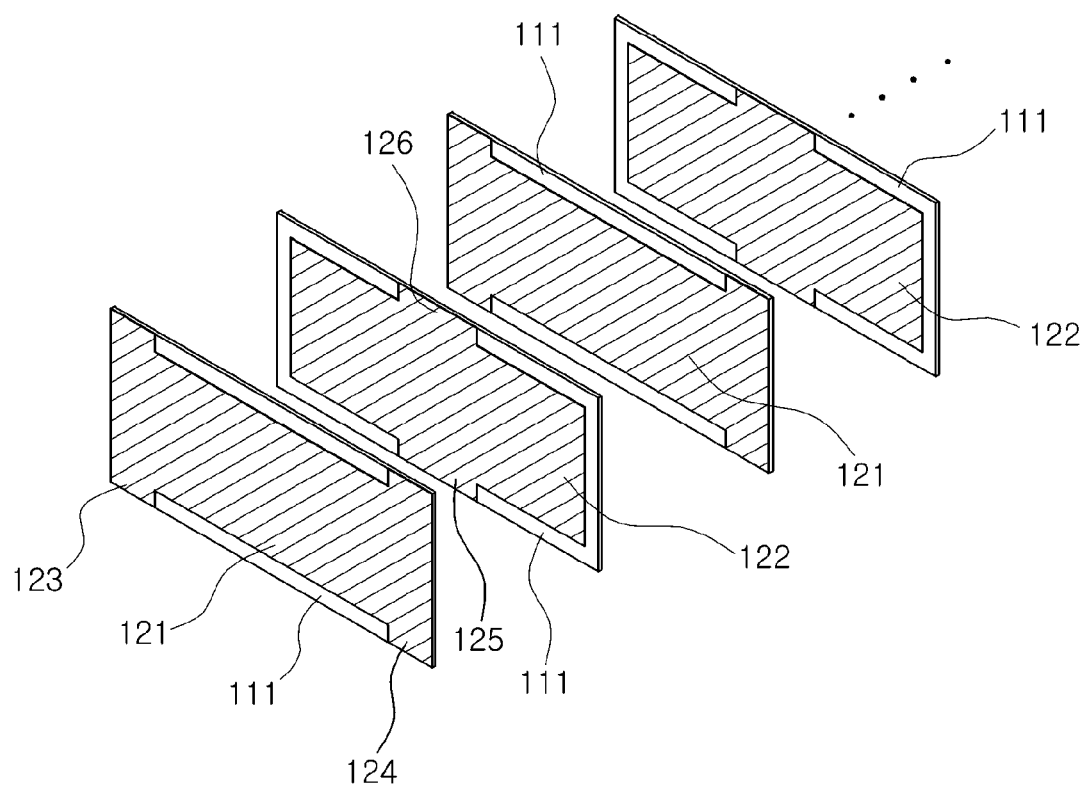
FIG. 3 is an exploded perspective view illustrating a structure of an internal electrode of the multilayer ceramic capacitor of FIG. 1.

FIG. 1 is a perspective view schematically illustrating a multilayer ceramic capacitor according to an exemplary embodiment in the present disclosure, FIG. 2 is a side view of FIG. 1, and FIG. 3 is an exploded perspective view illustrating a structure of an internal electrode of the multilayer ceramic capacitor of FIG. 1.

Referring to FIGS. 1 through 3, a multilayer ceramic capacitor 100 according to an exemplary embodiment of the present disclosure may include a ceramic body 110, a plurality of first and second internal electrodes 121 and 122, first to third lead-out portions 123 to 125, and first to third external electrodes 131 to 133.

The ceramic body 110 is formed by stacking a plurality of dielectric layers 111 of the ceramic body and then sintering the stacked dielectric layers. Adjacent dielectric layers 111 may be integrated so that a boundary therebetween is not readily apparent without using a scanning electron microscope (SEM).

A shape of the ceramic body 110 as described above is not particularly limited, but may be, for example, a hexahedral shape.

In the ceramic body 110, directions of a hexahedron will be defined in order to clearly describe exemplary embodiments of the present disclosure. L, W and T shown in FIG. 1 refer to a length direction, a width direction, and a thickness direction, respectively.

Further, in the exemplary embodiment of the present disclosure, for convenience of explanation, surfaces of the ceramic body 110 opposing each other in the thickness direction of the ceramic body may be defined as first and second surfaces S1 and S2, both end surfaces connecting the first and second surfaces S1 and S2 to each other and opposing each other in the length direction of the ceramic body may be defined as third and fourth surfaces S3 and S4, and both side surfaces opposing each other in the width direction of the ceramic body may be defined as fifth and sixth surfaces S5 and S6.

The dielectric layer 111 may contain a ceramic material having high permittivity, for example, barium titanate (BaTiO$_3$)-based ceramic powder, or the like, but the present disclosure is not limited thereto as long as sufficient capacitance may be obtained therefrom.

In addition, the dielectric layer 111 may further contain ceramic additives, an organic solvent, a plasticizer, a binder, a dispersant, and the like, in addition to the ceramic powder, as needed.

The ceramic additive may be a transition metal oxide or carbide, a rare earth element, magnesium (Mg), aluminum (Al), or the like, but the present disclosure is not limited thereto.

The first and second internal electrodes 121 and 122 having different polarities are alternately disposed so as to face each other with a respective ceramic sheet forming the dielectric layer 111 interposed therebetween, and may be portions overlapped with each other in a stacking direction thereof to thereby contribute to the formation of capacitance of the capacitor.

The first and second internal electrodes 121 and 122 may be electrically insulated from each other by the dielectric layer 111 disposed therebetween.

In this case, the first or the second internal electrode 121 or 122 may be disposed to be spaced apart from both third and fourth surfaces S3 and S4 of the ceramic body 110.

In addition, the first and second internal electrodes 121 and 122 may be formed using a conductive metal.

For example, the conductive metal formed using one of silver (Ag), palladium (Pd), platinum (Pt), nickel (Ni), and copper (Cu), an alloy thereof, or the like, may be used, but the present disclosure is not limited thereto.

The first and second lead-out portions 123 and 124 may be spaced apart from each other in the length direction of the ceramic body 110 and extended from the first internal electrode 121 so as to be exposed to the first surface S1, a mounting surface of the ceramic body 110.

The third lead-out portion 125 may be disposed between the first and second lead-out portions 123 and 124 and extended from the second internal electrode 122 so as to be exposed to the first surface S1 of the ceramic body 110.

The first and second external electrodes 131 and 132 having the same polarity may be disposed to be spaced apart from each other on the first surface S1 of the ceramic body 110 in the length direction of the ceramic body 110, and may contact the first and second lead-out portions 123 and 124 exposed to portions of the first surface S1 of the ceramic body 110, respectively, to thereby be electrically connected thereto.

The third external electrode 133, an electrode having a polarity different from that of the first and second external electrodes 131 and 132, may be used as a ground terminal in the exemplary embodiment of the present disclosure.

The third external electrode 133 may be disposed between the first and second external electrodes 131 and 132 in portions of the first surface S1 of the ceramic body 110, and contact the third lead-out portion 125 exposed to the first surface S1 of the ceramic body 110 to thereby be electrically connected thereto. In this case, at least one portion of the first to third external electrode 131, 132 and 133 extended to portions of the fifth and sixth surface S5 and S6. The exemplary embodiment of the present discloses the first to the third external electrode 131, 132 and 133 have each all the bands. If it is necessary, some portions of the first to third external electrode 131, 132 and 133 can have bands.

In this case, when a height of a portion of the first to the third external electrode 133 formed on the fifth or sixth surface S5 or S6 of the ceramic body 110 is defined as d, and a thickness of the ceramic body 110 is defined as T, a ratio of d/T may satisfy $0.10 \leq d/T$.

Further, when a length of the portion of the third external electrode 133 formed on the fifth or sixth surface S5 or S6 of the ceramic body 110 is defined as G, a ratio of d/G may satisfy $0.143 \leq d/G \leq 0.536$.

In addition, the first to third external electrodes 131 to 133 may be formed using a conductive metal.

For example, the conductive metal may be silver (Ag), nickel (Ni), copper (Cu), and the like, but the present disclosure is not limited thereto.

The first to third external electrodes 131 to 133 as described above may be formed by applying a conductive paste prepared by adding glass frit to a powder of the conductive metal and sintering the applied conductive paste, but the present disclosure is not limited thereto.

Further, a plating layer (not shown) may be formed on the first to third external electrodes 131 to 133, as needed. The plating layer is to increase adhesion strength between the multilayer ceramic capacitor 100 and a board at the time of mounting the multilayer ceramic capacitor 100 on the board using solder.

The plating layer may include, for example, a nickel (Ni) plating layer formed on the first to third external electrodes 131 to 133 and a tin (Sn) plating layer formed on the nickel plating layer.

Meanwhile, the first and second lead-out portions 123 and 124 may be extended from the first internal electrode 121 so as to be exposed to the second surface S2 opposing the mounting surface of the ceramic body 110.

In this case, the first and second external electrodes 131 and 132 may be disposed on the second surface S2 of the ceramic body 110.

In addition, the first and second lead-out portions 123 and 124 may be extended from the first internal electrode 121 so as to be exposed to the third and fourth surfaces S3 and S4 of the ceramic body 110.

In this case, the first and second external electrodes 131 and 132 may be extended from the first surface S1 of the ceramic body 110 to the third and fourth surfaces S3 and S4 of the ceramic body 110.

In the exemplary embodiment of the present disclosure, the first and second lead-out portions 123 and 124 may be exposed to all of the first and second surfaces S1 and S2 of the ceramic body and the third and fourth surfaces S3 and S4 of the ceramic body 110, but the present disclosure is not limited thereto.

In addition, when the first and second lead-out portions 123 and 124 are formed in the form in which portions of the first internal electrode 121 are exposed to all of the first and second surfaces S1 and S2 and the third and fourth surfaces S3 and S4 as in the exemplary embodiment of the present disclosure, the first and second external electrodes 131 and 132 respectively corresponding to the first and second lead-out portions 123 and 124 may be formed on the third and fourth surfaces S3 and S4 of the ceramic body 110, and may also be extended from the third and fourth surfaces S3 and S4 of the ceramic body 110 to portions of the fifth and sixth surfaces S5 and S6 of the ceramic body 110 and a portion of the second surface S2 of the ceramic body 110.

Therefore, a contact area between the first and second external electrodes 131 and 132 and the first and second lead-out portions 123 and 124 is increased, such that ESL may be decreased.

In addition, a fourth lead-out portion 126 may be extended from the second internal electrode 122 so as to be exposed to the second surface S2 of the ceramic body 110.

The fourth lead-out portion 126 may be disposed between the first and second lead-out portions 123 and 124 so as to be spaced apart from the first and second lead-out portions 123 and 124.

In this case, a fourth external electrode 134 may be formed on the second surface S2 of the ceramic body 110.

The fourth external electrode 134 may contact a portion of the fourth lead-out portion 126 exposed to the second surface S2 of the ceramic body 110 to thereby be electrically connected thereto.

In this case, the fourth external electrode 134 may be extended from the second surface S2 of the ceramic body 110 to portions of the fifth and sixth surfaces S5 and S6 of the ceramic body 110 in the width direction thereof.

Here, when a height of the portion of the fourth external electrode 134 formed on the fifth or sixth surface S5 or S6 of the ceramic body 110 is defined as d, and the thickness of the ceramic body 110 is defined as T, a ratio of d/T may satisfy $0.10 \leq d/T$.

In addition, when a length of the portion of the fourth external electrode 134 formed on the fifth or sixth surface S5 or S6 of the ceramic body 110 is defined as G, a ratio of d/G may satisfy $0.143 \leq d/G \leq 0.536$.

As described above, in the case in which the first and second lead-out portions 123 and 124 and the fourth lead-out portion 126 are also exposed to the second surface S2 of the ceramic body 110 to thereby form internal and external structures of the multilayer ceramic capacitor 100 so as to be vertically symmetric to each other, directionality of the multilayer ceramic capacitor 100 may be removed.

Therefore, at the time of mounting the multilayer ceramic capacitor 100 on the board, since the first and second surface S1 or S2 may also serve as a mounting surface, there is an advantage in that at the time of mounting the multilayer ceramic capacitor 100 on the board, a direction of the mounting surface needs not to be considered.

Experimental Example

The following Table 1 shows presence or absence of an adhesion strength defect and acoustic noise levels, depending on d/T and d/G of a multilayer ceramic capacitor. In the experimental example, the value of d and G may use the size of the third external electrode 133. In this case, presence or absence of an adhesion strength defect and acoustic noise levels of a fourth external electrode 134 disposed so as to oppose a third external electrode 133 in the thickness direction may be the same as those shown in the following Table 1.

Here, presence or absence of the adhesion strength defect was determined by applying force to the third external electrode 133 of the completed multilayer ceramic capacitor 100 of FIG. 1 for 10±1 seconds and then confirming whether or not the third external electrode 133 was separated from the ceramic body 110.

Further, the respective number of the samples on which an adhesion strength test was performed was 100, and the respective number of the samples on which acoustic noise measurement was performed was 10.

TABLE 1

| # | d/G | d/T | Presence or Absence of Adhesion Strength Defect (%) | Acoustic Noise (dB) |
|---|-----|-----|------|------|
| 1 | 0.000 | 0 | 80 | 20.2 |
| 2 | 0.036 | 0.025 | 65 | 20.8 |
| 3 | 0.071 | 0.05 | 34 | 21.3 |
| 4 | 0.107 | 0.075 | 8 | 22.1 |
| 5 | 0.143 | 0.1 | 0 | 22.5 |
| 6 | 0.179 | 0.125 | 0 | 23.7 |
| 7 | 0.214 | 0.15 | 0 | 23.9 |
| 8 | 0.250 | 0.175 | 0 | 24.2 |
| 9 | 0.286 | 0.2 | 0 | 24.5 |
| 10 | 0.321 | 0.225 | 0 | 24.9 |
| 11 | 0.357 | 0.25 | 0 | 25.4 |
| 12 | 0.393 | 0.275 | 0 | 25.9 |
| 13 | 0.429 | 0.3 | 0 | 26.3 |
| 14 | 0.464 | 0.325 | 0 | 27.2 |
| 15 | 0.500 | 0.35 | 0 | 28.9 |
| 16 | 0.536 | 0.375 | 0 | 29.1 |
| 17 | 0.571 | 0.4 | 0 | 30.5 |
| 18 | 0.607 | 0.425 | 0 | 32.5 |
| 19 | 0.643 | 0.45 | 0 | 35.8 |
| 20 | 0.679 | 0.475 | 0 | 36.7 |
| 21 | 0.714 | 0.5 | 0 | 36.9 | d/T indicates a ratio of a height d of the portion of the third external electrode 133 formed on the fifth or sixth surface S5 or S6 of the ceramic body 110 to a thickness T of the ceramic body 110 and affects adhesion strength of the third external electrode 133.

In the present Experimental Example, since in the third external electrode 133, a band portion is only disposed on a portion of the both side surfaces of the ceramic body 110 in the width direction, when the height thereof is excessively small as compared to the thickness of the ceramic body 110, in the case in which a predetermined level of force is applied to the third external electrode 133, the third external electrode 133 may be separated from the ceramic body 110.

Referring to Table 1, it may be appreciated that in the case of samples 1 to 4 in which d/T is less than 0.10, in the adhesion strength test, a defect that the third external electrode 133 is separated from the ceramic body 110 occurs in at least 8% and at most 80% of the samples. Therefore, it may be appreciated that in order to prevent an adhesion strength defect, d/T needs to be at least 0.1 or more as in samples 5 to 21.

d/G indicates a ratio of the height d to a length G of the portion of the third external electrode 133 formed on the fifth or sixth surface S5 or S6 of the ceramic body 110.

In the present Experimental Example, when d of the third external electrode 133 is decreased, an adhesion strength property corresponding to a mechanical strength property may be deteriorated. In addition, when G of the third external electrode 133 is increased, the adhesion strength property may be improved, but after the multilayer ceramic capacitor is mounted, short circuits may occur due to interference between terminals, and acoustic noise of the multilayer ceramic capacitor may be increased. When G is decreased, ESL of the capacitor may be increased.

Therefore, d/G may be in proportion to an amount of vibration transferred from the multilayer ceramic capacitor 100 to the outside through the third external electrode 133, and as a result, when d/G is increased, acoustic noise of the multilayer ceramic capacitor 100 may be increased.

In this case, when a reference value for determining whether or not an acoustic noise defect occurred was set to 30 dB, it may be confirmed that in the case in which d/G was more than 0.536, for example, in the cases of samples 17 to 21, the acoustic noise was more than 30 dB corresponding to the reference value.

Meanwhile, it may be confirmed that in the case in which d/G is less than 0.143, the adhesion strength defect occurred.

Therefore, in order to prevent the adhesion strength defect of the external electrode and decrease acoustic noise so as to be equal to or less than a predetermined reference value, the ratio d/G of the height d to the length G of the portion of the third external electrode 133 formed on the fifth or sixth surface S5 or S6 of the ceramic body 110 may satisfy $0.143 \leq d/G \leq 0.536$.

Modified Embodiment

Figure 4:
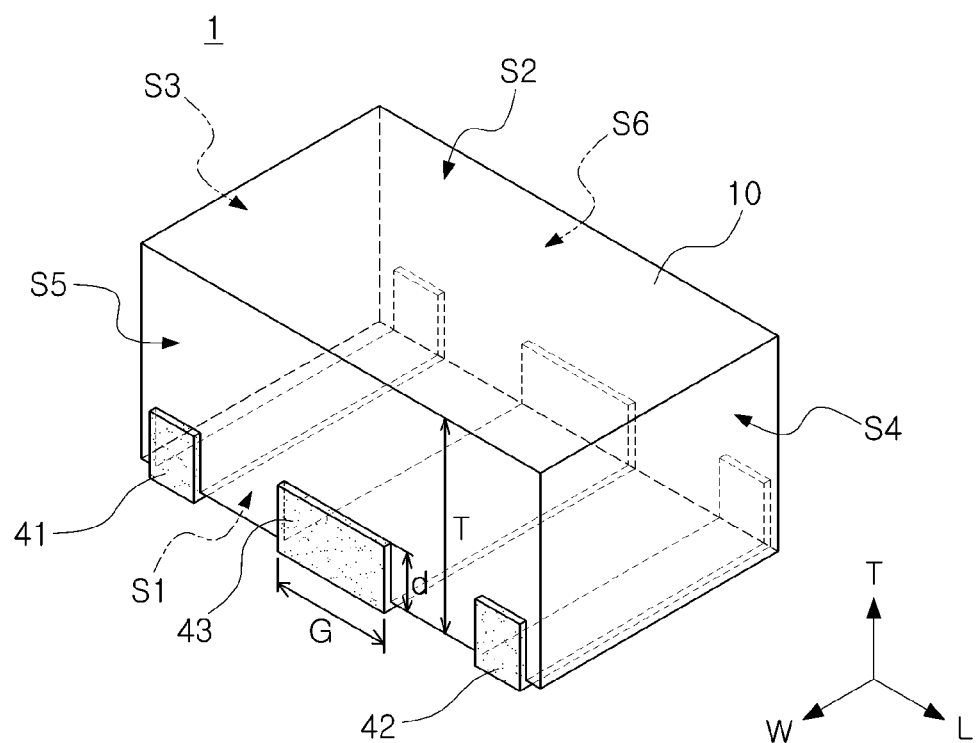
FIG. 4 is a perspective view schematically illustrating a multilayer ceramic capacitor according to another exemplary embodiment in the present disclosure.
Figure 5A:
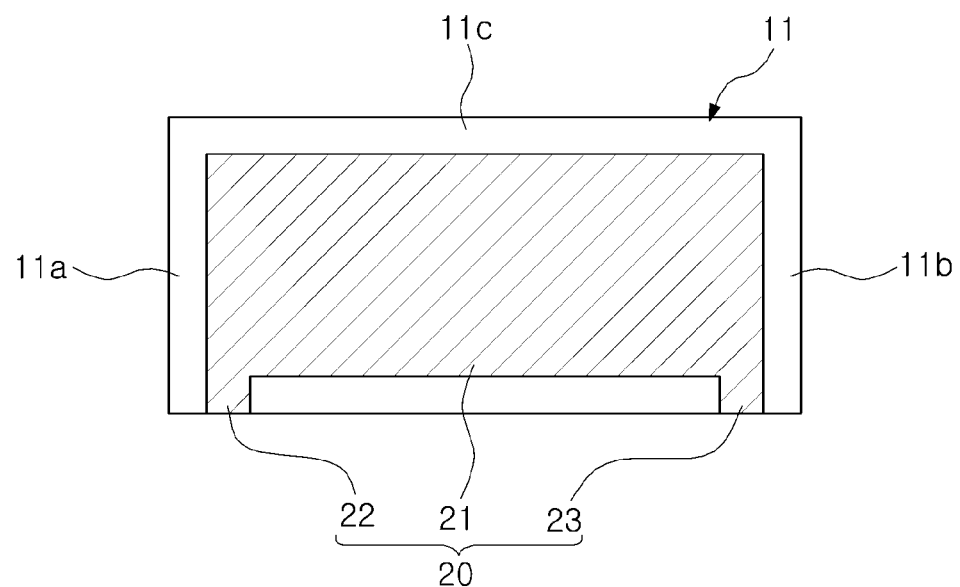
FIGS. 5A through 5B are plan views illustrating a structure of an internal electrode of the multilayer ceramic capacitor of FIG. 4.
Figure 5B:
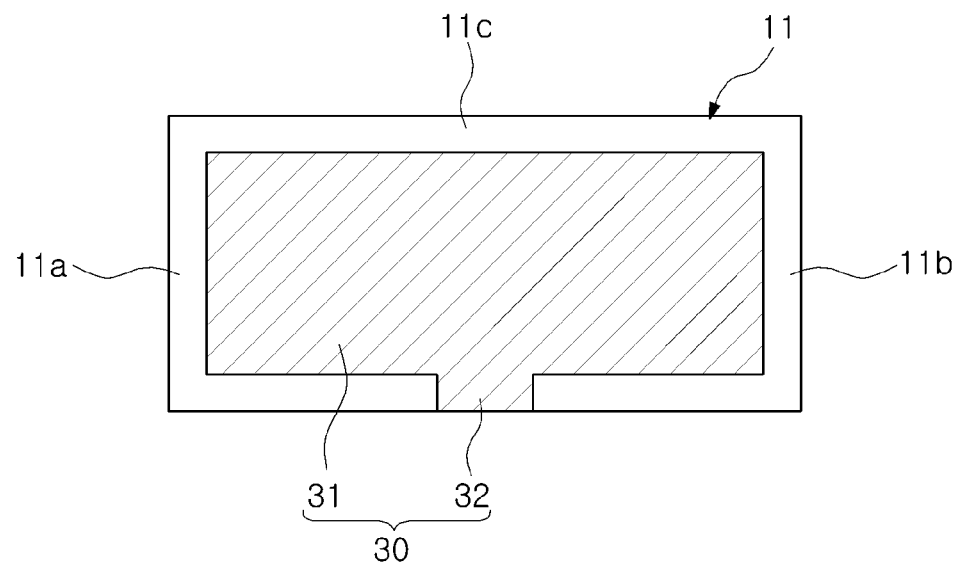

FIG. 4 is a perspective view schematically illustrating a multilayer ceramic capacitor according to another exemplary embodiment of the present disclosure, and FIG. 5 is a plan view illustrating a structure of an internal electrode of the multilayer ceramic capacitor of FIG. 4.

Here, a detailed description of portions that are the same as those in the foregoing exemplary embodiment of the present disclosure will be omitted in order to avoid an overlapping description, but portions having different structures from those in the foregoing exemplary embodiment of the present disclosure as described above will be described in detail.

Referring to FIGS. 4 and 5, in the multilayer ceramic capacitor 1 according to another exemplary embodiment of the present disclosure, a plurality of first and second internal electrodes 20 and 30 may be alternately disposed with each of the dielectric layers 11 interposed therebetween.

The first internal electrode 20 may have first and second lead-out portions 22 and 23 extended from a first body portion 21 and margin portions 11a and 11b between third and fourth surfaces S3 and S4 of a ceramic body 10.

In addition, a margin portion 11c may be provided between the first body portion 21 and an second surface S2 of the ceramic body 10.

The second internal electrode 30 may have a third lead-out portion 32 extended from a second body portion 31 and margin portions 11a and 11b between the third and fourth surfaces S3 and S4 of the ceramic body 10.

In addition, a margin portion 11c may be provided between the second body portion 31 and the second surface S2 of the ceramic body 10.

Here, the margin portions 11a to 11c form corner portions of the ceramic body 10 in which ceramic materials having high bonding strength contact each other and the third and fourth surfaces S3 and S4 of the ceramic body 10, such that a phenomenon in which delamination occurs at the corner portions of the ceramic body 10 and at the third and fourth surfaces S3 and S4 of the ceramic body 10 may be significantly decreased.

First and second external electrodes 41 and 42 may be formed on the first surface S1 of the ceramic body 10 so as to be spaced apart from the third and fourth surfaces S3 and S4 of the ceramic body 10 thereon. When necessary, the first and second external electrodes 41 and 42 may be extended from the first surface S1 of the ceramic body 10 to portions of fifth and sixth surfaces S5 and S6 of the ceramic body 10 in a width direction.

A third external electrode 43 may be disposed between the first and second external electrodes 41 and 42 and extended from the first surface S1 of the ceramic body 10 to portions of the fifth and sixth surfaces S5 and S6 of the ceramic body 10.

Figure 6:
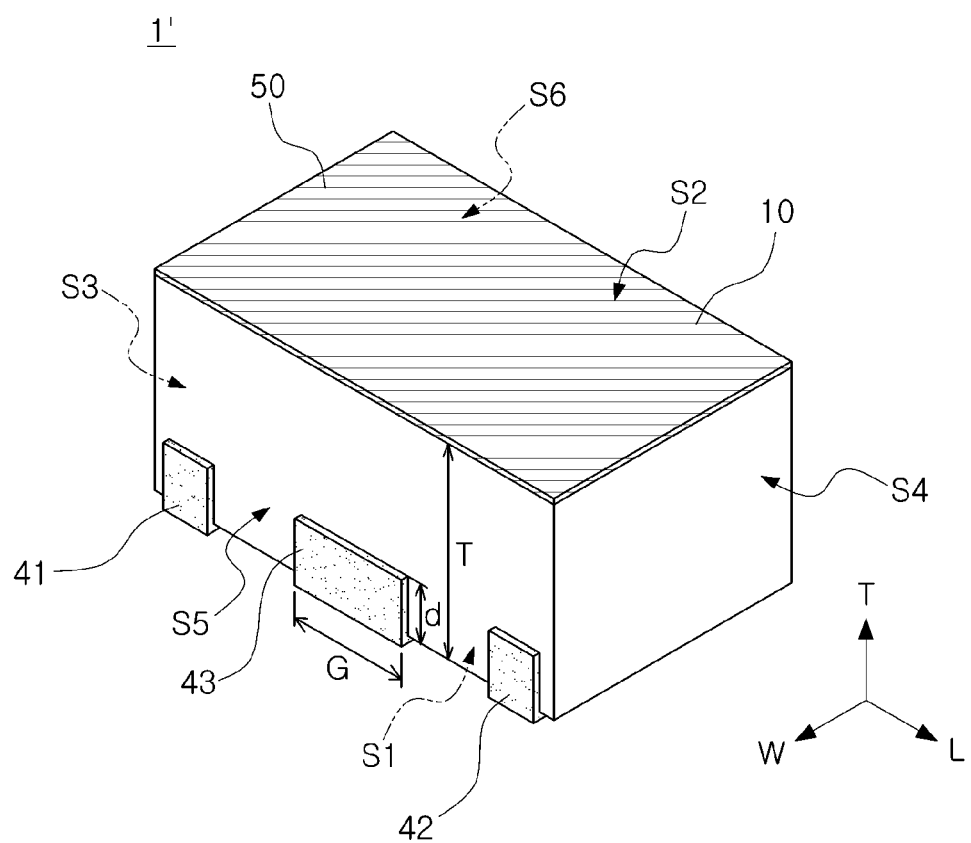
FIG. 6 is a perspective view schematically illustrating a multilayer ceramic capacitor according to another exemplary embodiment in the present disclosure.
Figure 7A:
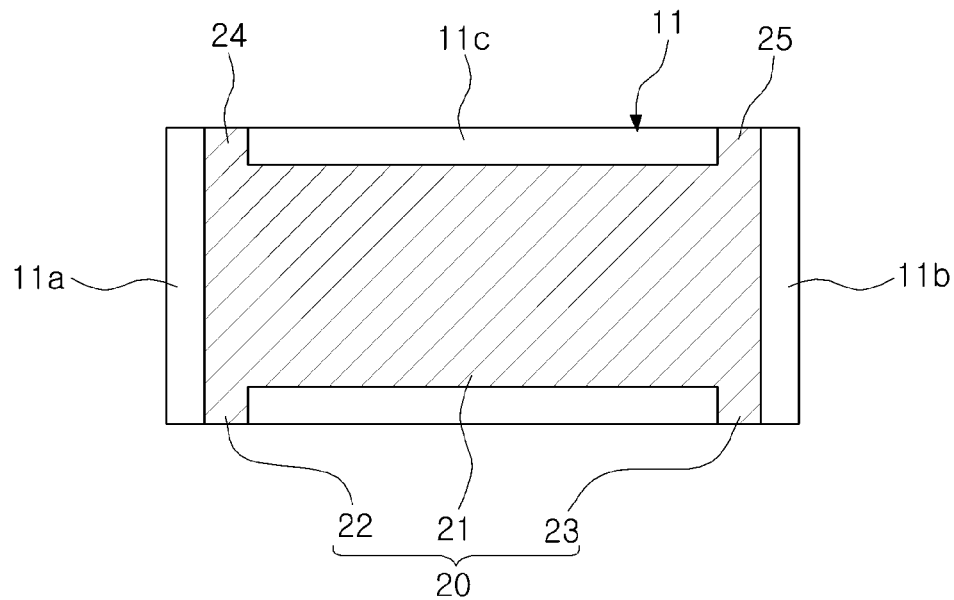
FIGS. 7A through 7B are plan views illustrating a structure of an internal electrode of the multilayer ceramic capacitor of FIG. 6.
Figure 7B:
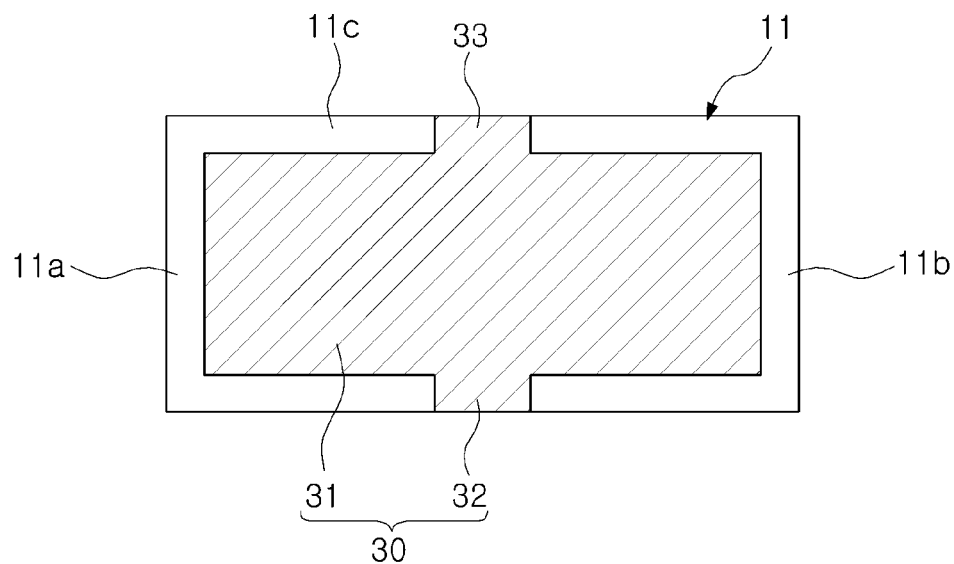

FIG. 6 is a perspective view schematically illustrating a multilayer ceramic capacitor 1' according to another exemplary embodiment of the present disclosure, and FIG. 7 is a plan view illustrating a structure of an internal electrode of the multilayer ceramic capacitor of FIG. 6.

Here, a detailed description of portions that are the same as those in the foregoing exemplary embodiment of the present disclosure will be omitted in order to avoid an overlapping description, but portions having different structures from those in the foregoing exemplary embodiment of the present disclosure will be described in detail.

Referring to FIGS. 6 and 7, in the multilayer ceramic capacitor 1' according to another exemplary embodiment of the present disclosure, a plurality of first and second internal electrodes 20 and 30 may be alternately disposed with each of the dielectric layers 11 interposed therebetween.

The first internal electrode 20 may further include fourth and fifth lead-out portions 24 and 25 extended from a first body portion 21 so as to be exposed to an second surface S2 of a ceramic body 10 and spaced apart from each other in a length direction of the ceramic body 10.

The second internal electrode 30 may further include a sixth lead-out portion 33 extended from a second body portion 31 so as to be exposed to the second surface S2 of the ceramic body 10 and provided between the fifth and sixth lead-out portions 24 and 25.

In this case, an insulation layer 50 may be disposed on the second surface S2 opposing a mounting surface of the ceramic body 10.

Figure 8:
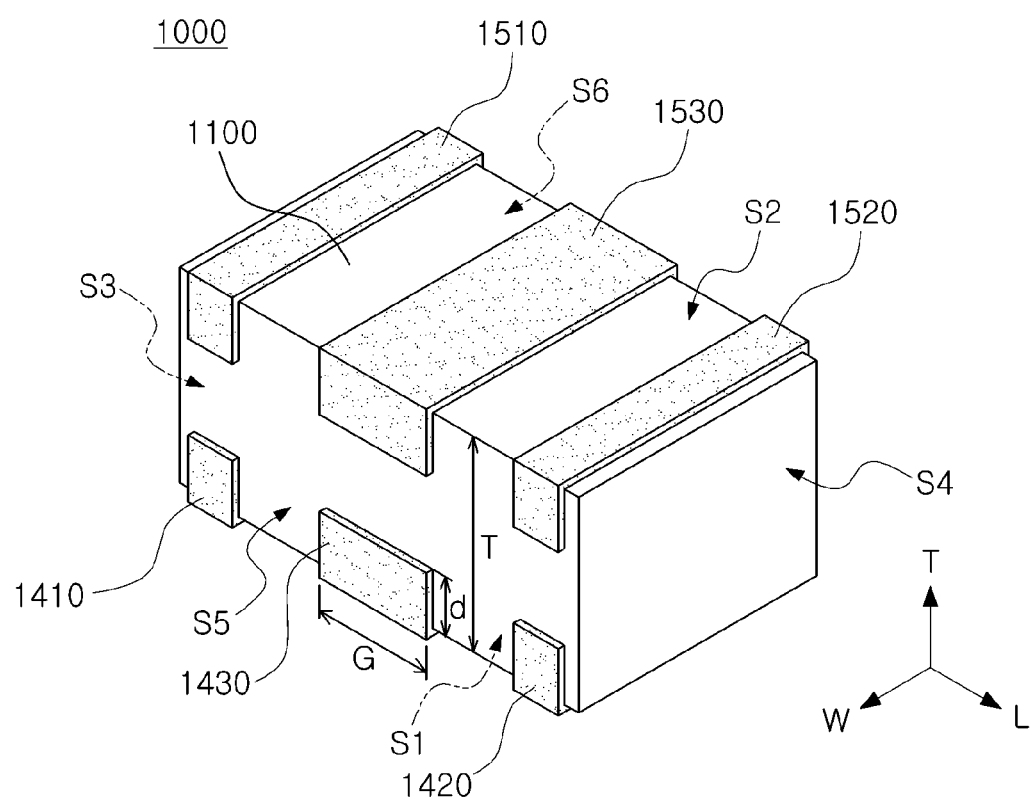
FIG. 8 is a perspective view schematically illustrating a multilayer ceramic capacitor according to another exemplary embodiment in the present disclosure.
Figure 9:
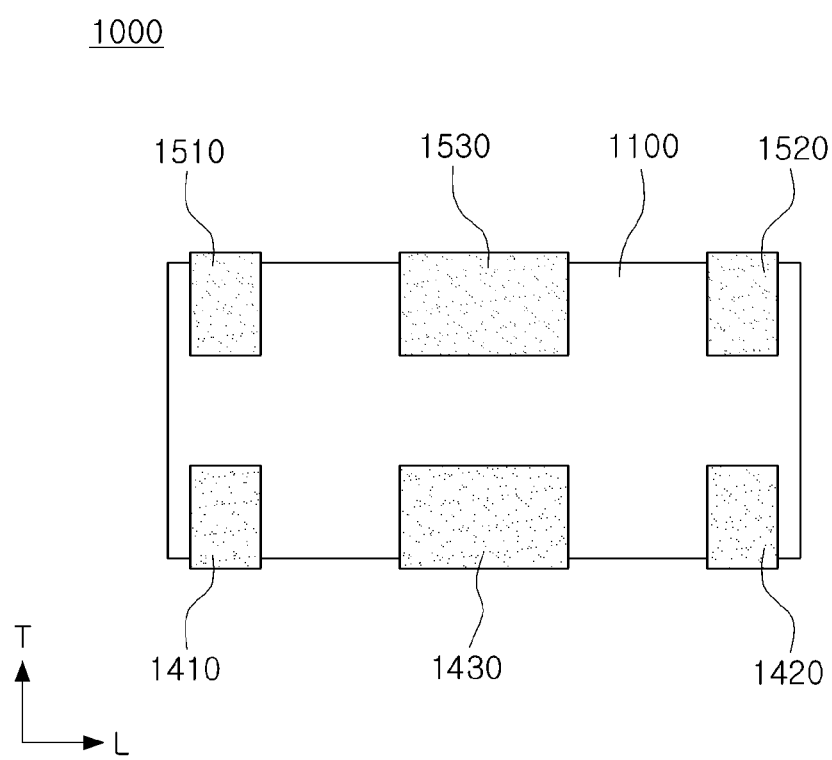
FIG. 9 is a side view of FIG. 8.
Figure 10:
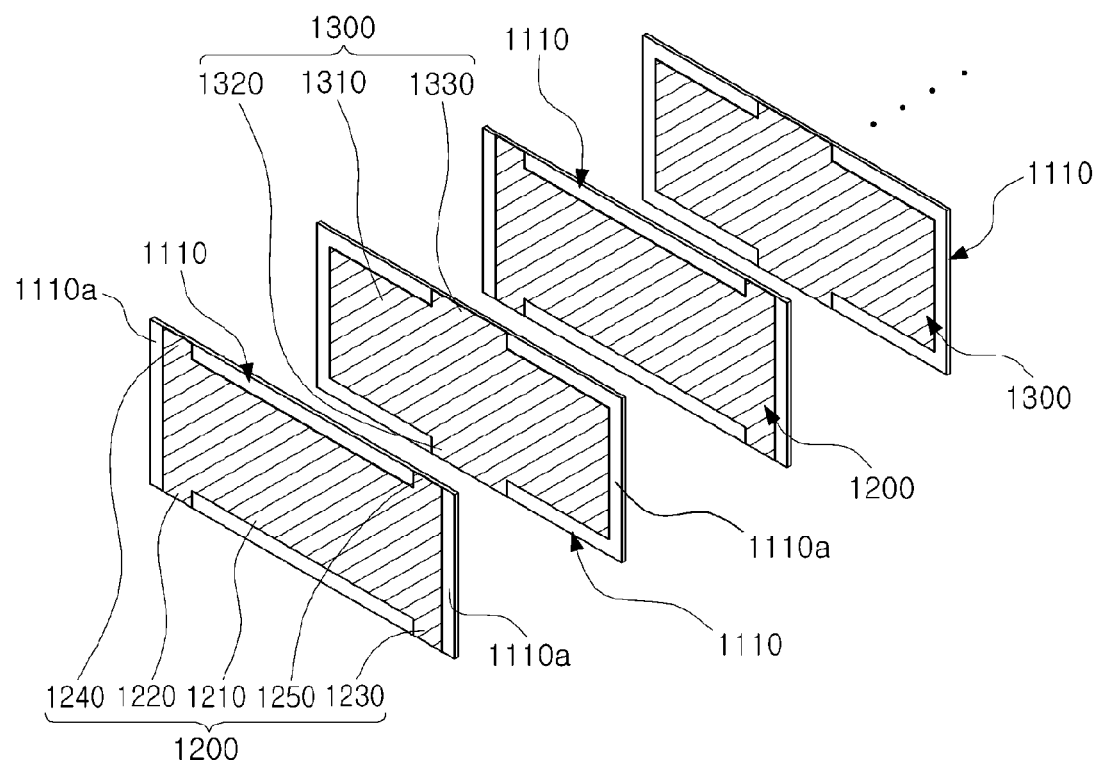
FIG. 10 is an exploded perspective view illustrating a structure of an internal electrode of the multilayer ceramic capacitor of FIG. 8.

FIG. 8 is a perspective view schematically illustrating a multilayer ceramic capacitor 1000 according to another exemplary embodiment of the present disclosure, FIG. 9 is a side view of FIG. 8, and FIG. 10 is an exploded perspective view illustrating a structure of an internal electrode of the multilayer ceramic capacitor of FIG. 8.

Here, a detailed description of portions that are the same as those in the exemplary embodiment as described above will be omitted in order to avoid an overlapping description, but portions having different structures from those in the exemplary embodiment as described above will be described in detail.

Referring to FIGS. 8 through 10, in the multilayer ceramic capacitor 1000 according to another exemplary embodiment of the present disclosure, a plurality of first and second internal electrodes 1200 and 1300 may be alternately disposed with each of the dielectric layers 1100 interposed therebetween.

The first internal electrode 1200 may include first and second lead-out portions 1220 and 1230 extended from a first body portion 1210 so as to be exposed to a first surface S1 of a ceramic body 1100 and spaced apart from each other in a length direction of the ceramic body 1110. The first internal electrode 1200 may further include fifth and sixth lead-out portions 1240 and 1250 extended from the first body portion 1210 so as to be exposed to an second surface S2 of the ceramic body 1100 and spaced apart from each other in the length direction of the ceramic body 1100.

In this case, margin portions 1110a may be provided between the first internal electrode 1200 and third and fourth surfaces S3 and S4 of the ceramic body 1100, respectively.

The second internal electrode 1300 may include a third lead-out portion 1320 extended from a second body portion 1310 so as to be exposed to the first surface S1 of the ceramic body 1100 and provided between the first and second lead-out portions 1220 and 1230. In addition, the second internal electrode 1300 may further include a fourth lead-out portion 1330 extended from the second body portion 1310 so as to be exposed to the second surface S2 of the ceramic body 1100 and provided between the fifth and sixth lead-out portions 1240 and 1250.

In this case, margin portions 1110a may be provided between the second internal electrode 1300 and the third and fourth surfaces S3 and S4 of the ceramic body 1100, respectively.

First and second external electrodes 1410 and 1420 may be formed on the first surface S1 of the ceramic body 1100 so as to be spaced apart from the third and fourth surfaces S3 and S4 of the ceramic body 1100. When necessary, the first and second external electrodes 1410 and 1420 may be extended from the first surface S1 of the ceramic body 1100 to portions of fifth and sixth surfaces S5 and S6 of the ceramic body 1100.

A third external electrode 1430 may be disposed between the first and second external electrodes 1410 and 1420 and extended from the first surface S1 of the ceramic body 1100 to portions of the fifth and sixth surfaces S5 and S6 of the ceramic body 1100.

Fifth and sixth external electrodes 1510 and 1520 may be disposed on the second surface S2 of the ceramic body 1100 so as to be spaced apart from each other thereon of the ceramic body 1100.

The fifth and sixth external electrodes 1510 and 1520 may be connected to the fifth and sixth lead-out portions 1240 and 1250, respectively.

In addition, a fourth external electrode 1530 may be disposed on the second surface S2 of the ceramic body 1100 so as to be located between the fifth and sixth external electrodes 1510 and 1520 thereon.

The fourth external electrode 1530 may be connected to the fourth lead-out portion 1330.

Board for Mounting of Multilayer Ceramic Capacitor

Figure 11:
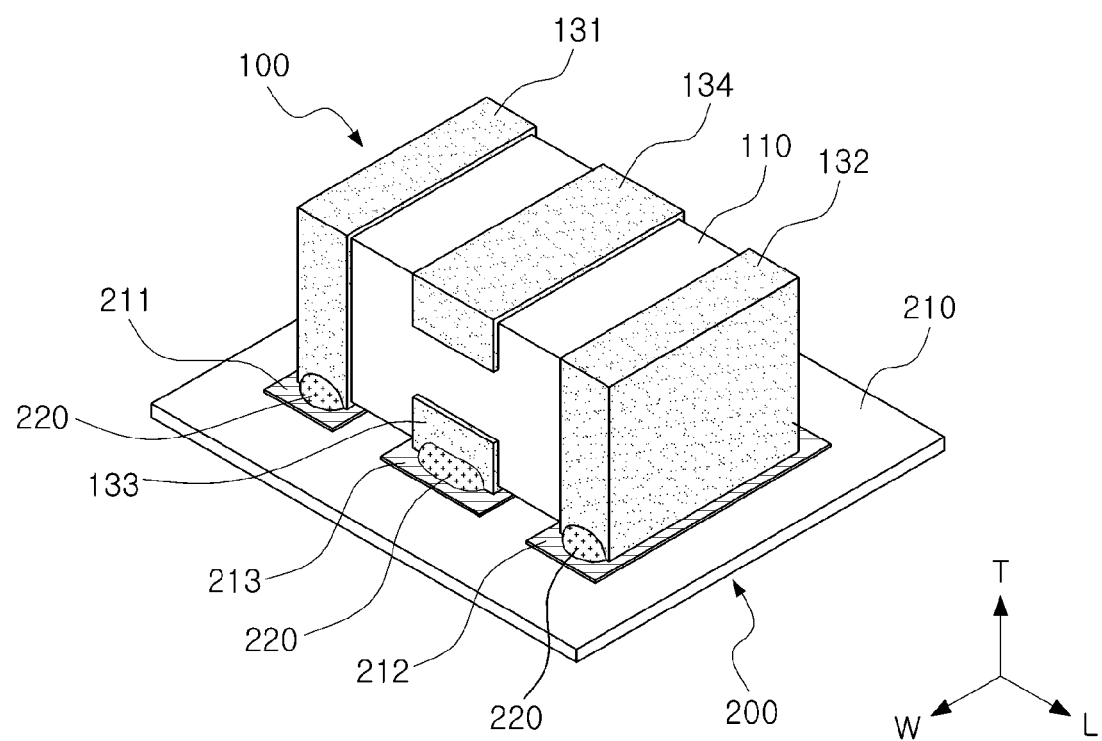
FIG. 11 is a perspective view schematically illustrating a form in which the multilayer ceramic capacitor of FIG. 1 is mounted on a board.
Figure 12:
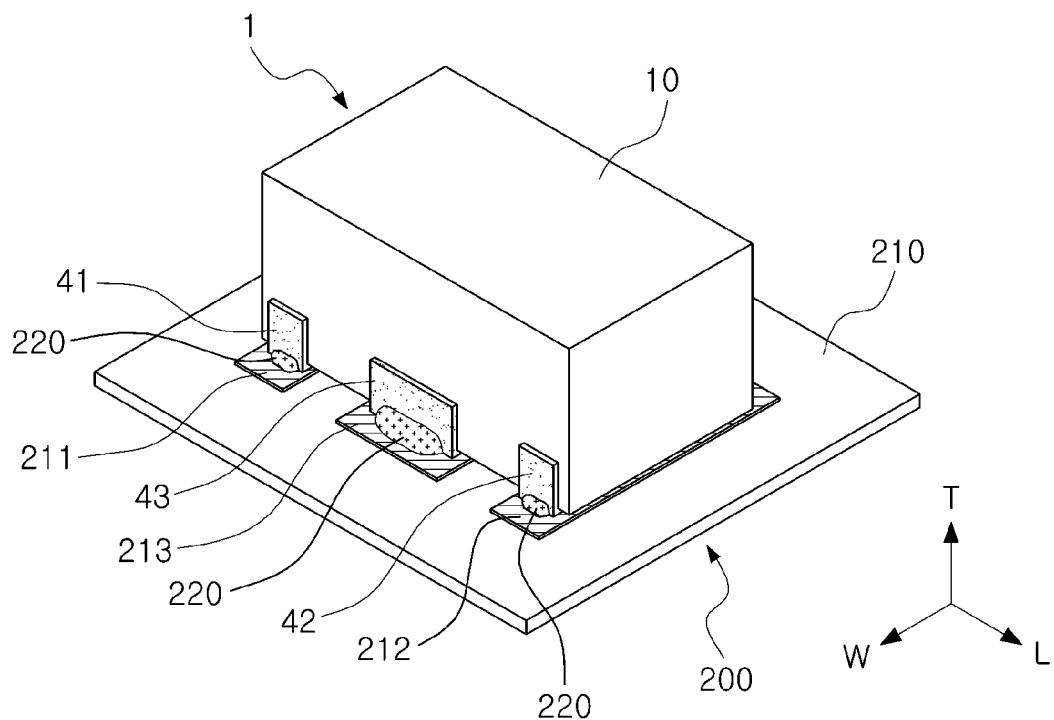
FIG. 12 is a perspective view schematically illustrating a form in which the multilayer ceramic capacitor of FIG. 4 is mounted on a board.
Figure 13:
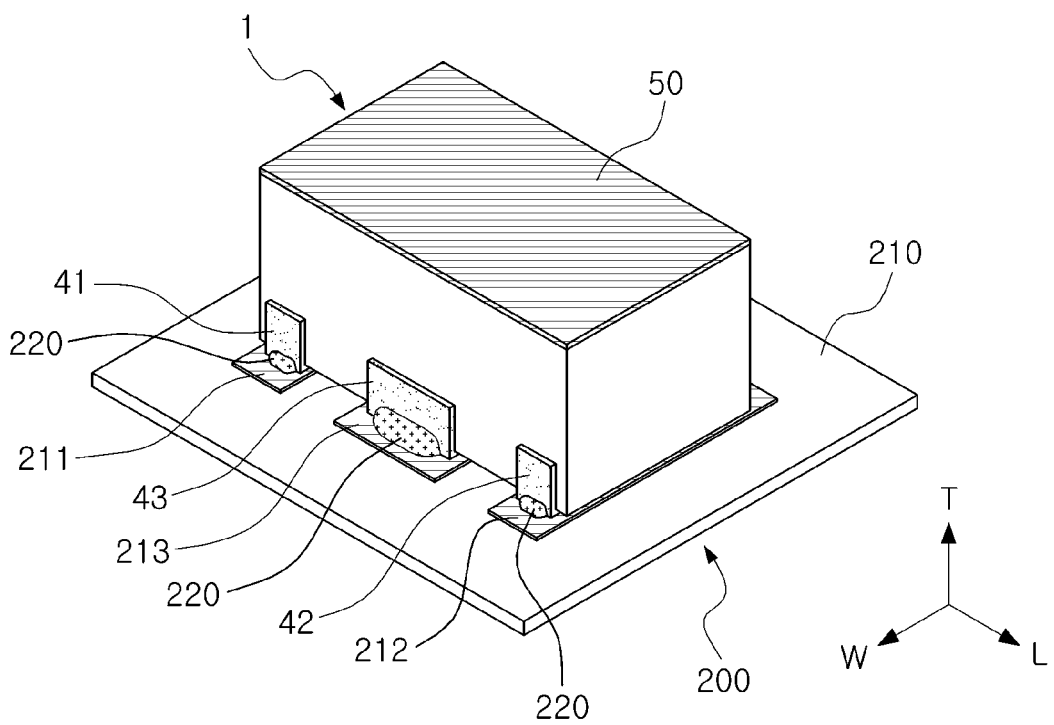
FIG. 13 is a perspective view schematically illustrating a form in which the multilayer ceramic capacitor of FIG. 6 is mounted on a board.
Figure 14:
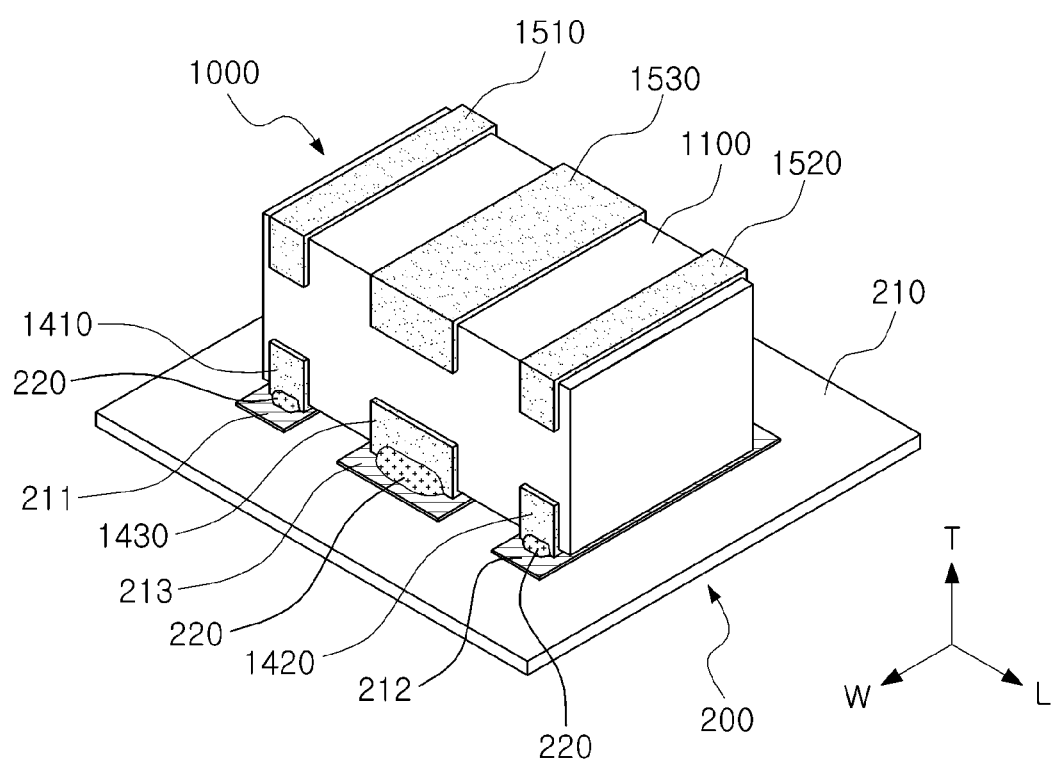
FIG. 14 is a perspective view schematically illustrating a form in which the multilayer ceramic capacitor of FIG. 8 is mounted on a board.

FIG. 11 is a perspective view schematically illustrating a form in which the multilayer ceramic capacitor of FIG. 1 is mounted on a board; FIG. 12 is a perspective view schematically illustrating a form in which the multilayer ceramic capacitor of FIG. 4 is mounted on a board; FIG. 13 is a perspective view schematically illustrating a form in which the multilayer ceramic capacitor of FIG. 6 is mounted on a board; and FIG. 14 is a perspective view schematically illustrating a form in which the multilayer ceramic capacitor of FIG. 8 is mounted on a board.

Referring to FIGS. 11 through 14, a board 200 for mounting of the multilayer ceramic capacitor 100, 1, 1', or 1000 according to exemplary embodiments of the present disclosure may include a substrate 210 on which the multilayer ceramic capacitor 100, 1, 1', or 1000 is mounted and first to third electrode pads 211 to 213 formed on the substrate 210 to be spaced apart from each other.

In this case, the multilayer ceramic capacitor 100, 1, 1', or 1000 may be electrically connected to the substrate 210 by solder 220 in a state in which the first surface S1 of the ceramic body 110, 10, or 1100, which is a mounting surface, is disposed downwardly, and the first to third external electrodes 131 to 133 are positioned on the first to third electrodes pads 211 to 213 so as to contact each other, respectively.

In the multilayer ceramic capacitor 100, 1, 1', or 1000 according to the exemplary embodiment of the present disclosure, the first and second internal electrodes are disposed to be perpendicular with respect to the substrate 210, and a current may flow from the first to third electrode pads 211 to 213 of the substrate 210 disposed so as to be adjacent to each other to the first and second internal electrodes through the first to third external electrodes 131 to 133, such that a current path may be decreased.

Therefore, ESL may be decreased as compared to a multilayer ceramic capacitor including internal electrodes disposed horizontally with respect to a substrate and a structure of external electrodes corresponding thereto, and such ESL may be further decreased in accordance with an increase in the number of stacked internal electrodes.

As an example, in the case in which the multilayer ceramic capacitor is used as a three-terminal EMI filter, the first and second external electrodes are connected to input and output terminals of a signal line, respectively, and the third external electrodes is connected to a ground terminal, such that high frequency noise of the signal line may be removed.

In this case, the first and second electrode pads 211 and 212 having a positive (+) polarity may correspond to the input and output terminals, respectively, and the third electrode pad 213 having a negative (−) polarity may correspond to the ground terminal.

As another application example, in the case in which the multilayer ceramic capacitor is used as a decoupling capacitor, the first and second external electrodes are connected to a power line, and the third external electrode is connected to a ground line, such that a power supply circuit may be stabilized.

In this case, the first and second electrode pads 211 and 212 may correspond to the power line, and the third electrode pad 213 may correspond to the ground terminal.

As set forth above, according to exemplary embodiments of the present disclosure, since ESL of the multilayer ceramic capacitor may be decreased, in the case of using the multilayer ceramic capacitor as the decoupling capacitor, the EMI filter, and the like, a voltage change of the power supply circuit may be more effectively suppressed, and high frequency attenuation characteristics and high frequency noise removal effect may be improved.

In addition, adhesion strength of the external electrode may be improved, such that reliability of products may be improved, and at the time of mounting the multilayer ceramic capacitor on the board, acoustic noise may be decreased.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor comprising:
a ceramic body in which a plurality of dielectric layers are stacked;
a plurality of first and second internal electrodes alternately disposed with each of the dielectric layers interposed between the plurality of first and second internal electrodes;
first and second lead-out portions extended from the first internal electrode to be exposed to a mounting surface of the ceramic body and spaced apart from each other in a length direction of the ceramic body;
a third lead-out portion extended from the second internal electrode to be exposed to the mounting surface of the ceramic body and provided between the first and second lead-out portions;
first and second external electrodes disposed on the mounting surface of the ceramic body, and connected to the first and second lead-out portions, respectively;
a third external electrode disposed between the first and second external electrodes, and electrically connected to the third lead-out portion;
fifth and sixth lead-out portions extended from the first internal electrode so as to be exposed to the surface opposing the mounting surface of the ceramic body and provided to be spaced apart from each other in the length direction of the ceramic body;
a fourth lead-out portion extended from the second internal electrode so as to be exposed to the surface opposing the mounting surface of the ceramic body and provided between the fifth and sixth lead-out portions; and
an insulation layer disposed on the surface opposing the mounting surface of the ceramic body,
wherein at least one portion of the first to third external electrode extended to portions of both surfaces of the ceramic body in the width direction, and
in which $0.10 \leq d/T$ wherein d is a height of at least one of the first to third external electrodes formed on one side surface of the ceramic body in the width direction, and T is a thickness of the ceramic body.

2. A board for mounting of a multilayer ceramic capacitor comprising:
a substrate provided with first to third electrode pads formed on the substrate; and
the multilayer ceramic capacitor of claim 1, including the first to third external electrodes mounted on the first to third electrode pads, respectively.

3. A multilayer ceramic capacitor comprising:
a ceramic body in which a plurality of dielectric layers are stacked;
a plurality of first and second internal electrodes alternately disposed with each of the dielectric layers interposed between the plurality of first and second internal electrodes;
first and second lead-out portions extended from the first internal electrode to be exposed to a mounting surface of the ceramic body and spaced apart from each other in a length direction of the ceramic body;
a third lead-out portion extended from the second internal electrode to be exposed to the mounting surface of the ceramic body and provided between the first and second lead-out portions;
first and second external electrodes disposed on the mounting surface of the ceramic body, and connected to the first and second lead-out portions, respectively;
a third external electrode disposed between the first and second external electrodes, and electrically connected to the third lead-out portion;
fifth and sixth lead-out portions extended from the first internal electrode so as to be exposed to the surface opposing the mounting surface of the ceramic body and provided to be spaced apart from each other in the length direction of the ceramic body;
a fourth lead-out portion extended from the second internal electrode so as to be exposed to the surface opposing the mounting surface of the ceramic body and provided between the fifth and sixth lead-out portions;
fifth and sixth external electrodes disposed on the surface opposing the mounting surface of the ceramic body and electrically connected to the fourth and fifth lead-out portions, respectively; and
a fourth external electrode disposed between the fifth and sixth external electrodes, and electrically connected to the sixth lead-out portion,
wherein the first and second internal electrodes are disposed to be spaced apart from both surfaces of the ceramic body in the length direction,
wherein at least one portion of the first to third external electrode extended to portions of both surfaces of the ceramic body in the width direction, and in which 0.10≤d/T wherein d is a height of at least one of the first to third external electrodes formed on one side surface of the ceramic body in the width direction, and T is a thickness of the ceramic body.

4. The multilayer ceramic capacitor of claim 3, wherein at least one portion of the fourth to sixth external electrode extended to the portions of both surfaces of the ceramic body in the width direction.

5. The multilayer ceramic capacitor of claim 4, in which 0.10≤d/T
wherein d is a height of at least one portion of the fourth to sixth external electrode formed on one side surface of the ceramic body in the width direction, and T is the thickness of the ceramic body.

6. The multilayer ceramic capacitor of claim 3, in which 0.143≤d/G≤0.536
Wherein G is a length of at least one portion of the fourth to sixth external electrode formed on one side surface of the ceramic body in the width direction.

7. A board for mounting of a multilayer ceramic capacitor comprising:
a substrate provided with first to third electrode pads formed on the substrate; and
the multilayer ceramic capacitor of claim 3, including the first to third external electrodes mounted on the first to third electrode pads, respectively.

* * * * *